(12) United States Patent
Ueda et al.

(10) Patent No.: US 8,681,565 B2
(45) Date of Patent: Mar. 25, 2014

(54) SEMICONDUCTOR MEMORY DEVICE

(71) Applicant: Panasonic Corporation, Osaka (JP)

(72) Inventors: Takanori Ueda, Osaka (JP); Masayoshi Nakayama, Kyoto (JP); Kazuyuki Kouno, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/709,995

(22) Filed: Dec. 10, 2012

(65) Prior Publication Data

US 2013/0148423 A1  Jun. 13, 2013

Related U.S. Application Data

(63) Continuation of application No. PCT/JP2011/002633, filed on May 11, 2011.

(30) Foreign Application Priority Data

Jun. 9, 2010 (JP) ................. 2010-131801

(51) Int. Cl.
*G11C 11/34* (2006.01)

(52) U.S. Cl.
USPC ............. 365/185.2; 365/210.1; 365/210.13; 365/185.13

(58) Field of Classification Search
USPC ............ 365/185.2, 210.1, 210.13, 185.13
See application file for complete search history.

(56) References Cited

U.S. PATENT DOCUMENTS

| | | | |
|---|---|---|---|
| 2002/0036914 A1 | 3/2002 | Hayashi | |
| 2003/0189853 A1* | 10/2003 | Tanizaki et al. | 365/200 |
| 2004/0095824 A1* | 5/2004 | Kurumada et al. | 365/205 |
| 2005/0047234 A1 | 3/2005 | Kamata | |
| 2005/0276112 A1 | 12/2005 | Kido et al. | |
| 2007/0183240 A1 | 8/2007 | Maruyama et al. | |
| 2010/0097866 A1* | 4/2010 | Kobayashi | 365/189.07 |

FOREIGN PATENT DOCUMENTS

| | | | |
|---|---|---|---|
| JP | 09-245493 A | | 9/1997 |
| JP | 2002-100196 A | | 4/2002 |
| WO | WO-2005/109442 A1 | | 11/2005 |

OTHER PUBLICATIONS

International Search Report mailed Aug. 16, 2011 issued in corresponding International Application No. PCT/JP2011/002633.

* cited by examiner

*Primary Examiner* — Vu Le
*Assistant Examiner* — Han Yang
(74) *Attorney, Agent, or Firm* — McDermott Will & Emery LLP

(57) ABSTRACT

A main bit line is disposed between a reference main bit line and core main bit lines. A selection transistor disposed between a sub bit line connected to a cell and the main bit line can switch between a conductive state and a non-conductive state independently of other selection transistors. A dummy main bit line can be set to ground potential by a shield grounding section, and can be used as a shield line of the reference main bit line.

13 Claims, 13 Drawing Sheets

SEMICONDUCTOR MEMORY DEVICE

CROSS-REFERENCE TO RELATED APPLICATION

This is a continuation of PCT International Application PCT/JP2011/002633 filed on May 11, 2011, which claims priority to Japanese Patent Application No. 2010-131801 filed on Jun. 9, 2009. The disclosures of these applications including the specifications, the drawings, and the claims are hereby incorporated by reference in their entirety.

BACKGROUND

The present disclosure relates to semiconductor memory devices, and specifically to a method for shielding a main bit line for a reference cell.

In semiconductor memory devices such as flash memory devices, a bit line and a word line are selected to specify a memory cell in a memory cell array, and the memory cell can thus be accessed. The bit line includes a main bit line and a sub bit line, the main bit line is connected to one end of the sub bit line via a selection transistor, and the other end of the sub bit line is connected to the memory cell. When data is read from a memory cell, a sense amplifier compares a current value or a voltage value of the specified memory cell with a current value or a voltage value of a reference cell serving as a reference to determine whether the data is "0" or "1."

In an virtual ground-type memory cell array, when a memory cell adjacent to a memory cell which is to be accessed is in an erased state, a leakage current is caused. In contrast, when the memory cell adjacent to the memory cell which is to be accessed is in a written state, the leakage current can be prevented by charges which have been charged in the adjacent memory cell (see FIG. 1 of International Patent Publication No. WO 2005/109442). Thus, a dummy cell is disposed at an end of the memory cell array, and the dummy cell is set to the written state, so that it is possible to prevent the leakage current of the memory cell. International Patent Publication No. WO 2005/109442 has proposed a method for preventing a leakage current of a reference cell by disposing a dummy cell at an end of a reference cell array, and setting the dummy cell to the written state (see FIG. 5 and FIG. 6 of International Patent Publication No. WO 2005/109442). Japanese Patent Publication No. 2002-100196 is cited for reference.

SUMMARY

Here, when the dummy cell is disposed to be adjacent to the reference cell as described above, a main bit line connected to the dummy cell is adjacent to a main bit line connected to the reference cell. This causes a problem where when, for example, the dummy cell is accessed, the main bit line of the reference cell may be influenced, under the influence of a parasitic capacitance between the main bit lines, by the main bit line connected to the dummy cell. The influence over the main bit line of the reference cell may cause variations in current value or voltage value of the reference cell serving as the reference, so that it may no longer be possible to properly determine whether data is "0" or "1."

Solutions for the problem described above include disposing a shield line between a reference main bit line and other main bit lines to prevent the reference main bit line from being influenced by other main bit lines. For example, Japanese Patent Publication No. H09-245493 proposes a method in which a shield line is disposed between memory blocks or between a reference main bit line and other main bit lines (see FIG. 1 of Japanese Patent Publication No. H09-245493). However, the method causes another problem where the area of a semiconductor memory device increases by the shield line, which has to be disposed between the reference main bit line and other main bit lines.

In one aspect, the instant application describes a semiconductor memory device in which a shield of a main bit line for a reference cell can be obtained without increasing the area of the semiconductor memory device.

In an aspect of the present disclosure, a semiconductor memory device includes: a memory cell array including a reference cell, a plurality of core cells, and a third memory cell; a first main bit line for the reference cell; a second main bit line group for the plurality of core cells; a third main bit line for the third memory cell, the third main bit line being disposed between the first main bit line and the second main bit line group; a first selection transistor disposed between a reference cell sub bit line connected to the reference cell and the first main bit line, the first selection transistor being configured to electrically connect the reference cell sub bit line to the first main bit line when in a conductive state, and to electrically disconnect the reference cell sub bit line from the first main bit line when in a non-conductive state; a second selection transistor group provided between the second main bit line group and core cell sub bit lines connected to the plurality of core cells, the second selection transistor group being configured to electrically connect the core cell sub bit lines to the second main bit line group when in the conductive state, and to electrically disconnect the core cell sub bit lines from the second main bit line group when in the non-conductive state; a third selection transistor which is provided between a third memory cell sub bit line connected to the third memory cell and the third main bit line, and is configured to electrically connect the third memory cell sub bit line to the third main bit line when in the conductive state, and to electrically disconnect the third memory cell sub bit line from the third main bit line when in the non-conductive state; a column decoder configured to perform gate control to set the first selection transistor, the second selection transistor group, and the third selection transistor to the conductive state or the non-conductive state; and a shield grounding section capable of setting the third main bit line to ground potential, wherein the third selection transistor is connected to the column decoder, is electrically isolated from the first selection transistor and the second selection transistor group, and is configured to be switched between the conductive and non-conductive states by the column decoder independently of the first selection transistor and the second selection transistor group.

With this configuration, the third main bit line for the third memory cell is disposed between the first main bit line for the reference cell and the second main bit lines for the plurality of core cells. The third selection transistor disposed between the sub bit line connected to the third memory cell and the third main bit line electrically connects the sub bit line to the third main bit line when in the conductive state, whereas the third selection transistor electrically disconnects the sub bit line from the third main bit line when in the non-conductive state. Moreover, the third selection transistor is connected to the column decoder, is electrically isolated from the other selection transistors, and is configured to be switched between the conductive and non-conductive states independently from the other selection transistors. Furthermore, the third main bit line is set to the ground potential by the shield grounding section. Thus, the third main bit line is set by the third selection transistor with the non-conductive state to electrically disconnect the third main bit line from the sub bit line, and then the third main bit line is set to the ground potential by the shield grounding section, so that the third main bit line can serve as a shield line of the first main bit line. Thus, a shield of the main bit line for the reference cell can be obtained without providing a new shield line.

According to the present disclosure, the shield of the main bit line for the reference cell can be obtained without increasing the area of the semiconductor memory device.

DETAILED DESCRIPTION

Embodiments of the present disclosure will be described in detail below with reference to the drawings.

First Embodiment

Figure 1:
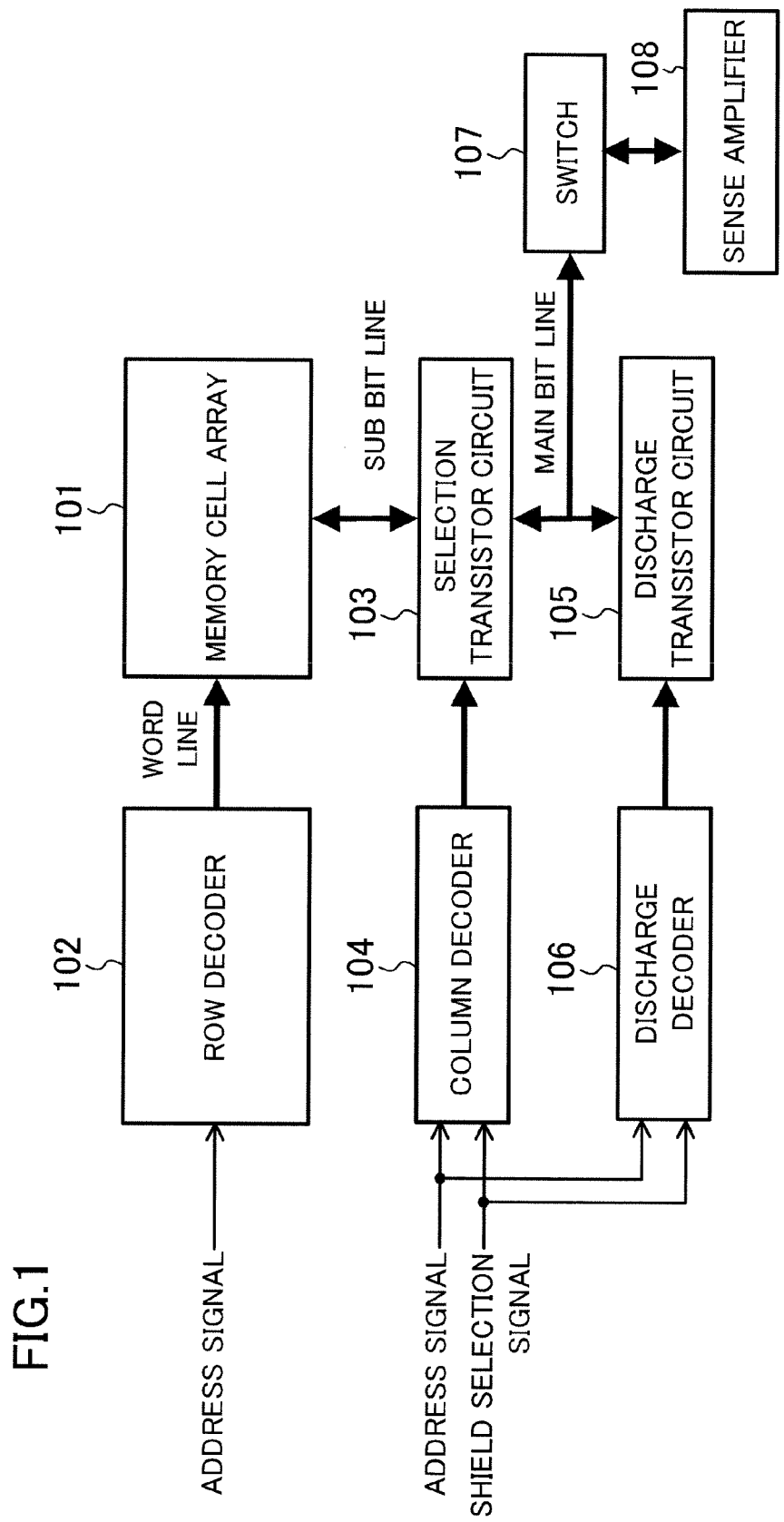
FIG. 1 is a view schematically illustrating a circuit configuration of a semiconductor memory device according to a first embodiment.

FIG. 1 schematically illustrates a circuit configuration of a semiconductor memory device according to a first embodiment. The semiconductor memory device of the first embodiment is, for example, a flash memory. As illustrated in FIG. 1, circuits in the periphery of a memory cell array 101 include a row decoder 102, a selection transistor circuit 103, a column decoder 104, a discharge transistor circuit 105, a discharge decoder 106, a switch 107, and a sense amplifier 108. One end of a sub bit line and one end of a word line are connected to the memory cell array 101, the other end of the sub bit line is connected to the selection transistor circuit 103, and the other end of the word line is connected to the row decoder 102. The row decoder 102 receives an address signal for selecting a row of the memory cell array 101. In addition to the sub bit line, a main bit line and the column decoder 104 are connected to the selection transistor circuit 103. The main bit line is connected to the selection transistor circuit 103, the discharge transistor circuit 105, and the switch 107. The discharge transistor circuit 105 is further connected to the discharge decoder 106, and the switch 107 is further connected to the sense amplifier 108. The column decoder 104 and the discharge decoder 106 receive an address signal for selecting a column of the memory cell array and a shield selection signal for controlling shield operation which will be described later. The sense amplifier 108 is a circuit which includes a first input terminal and a second input terminal, and is configured to perform comparison between voltage values or current values input to the first and second input terminals. The switch 107 selectively connects a reference main bit line which will be described later to the first input terminal of the sense amplifier 108, and selectively connects a core main bit line and a dummy main bit line which will be described later to the second input terminal of the sense amplifier 108. That is, the sense amplifier 108 receives a voltage value and a current value serving as references at the first input terminal, and a voltage value and a current value of an accessed memory cell at the second input terminal to determine whether data is "0" or "1."

Figure 2:
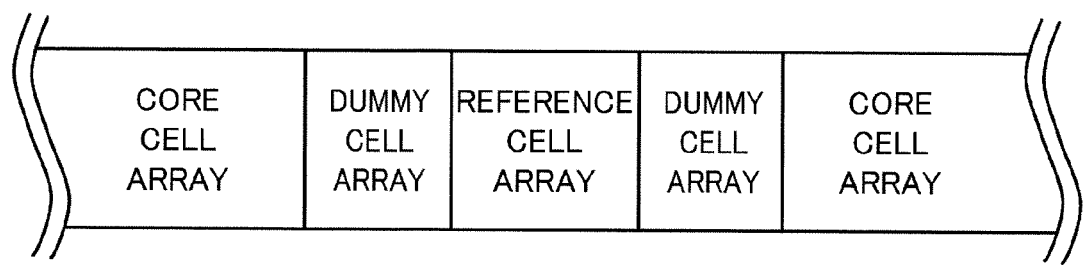
FIG. 2 is a view schematically illustrating a configuration of a memory cell array of FIG. 1.

FIG. 2 is a view schematically illustrating a configuration of the memory cell array of FIG. 1. As illustrated in FIG. 2, the memory cell array includes a reference cell array having a reference cell, a dummy cell array having a dummy cell, and a core cell array having a core cell. The dummy cell array is disposed between the reference cell array and the core cell array.

Here, the term "reference cell" refers to a memory cell configured to generate a reference voltage value or a reference current value used to determine whether data is "0" or "1." The term "core cell" refers to a memory cell in which data is stored by a user. The term "dummy cell" refers to a memory cell which is not usually used to store data, but is used for tests, evaluations, analyses, etc. In the present embodiment, a main bit line for the dummy cell is used as a shield line of a main bit line for the reference cell.

Figure 3:
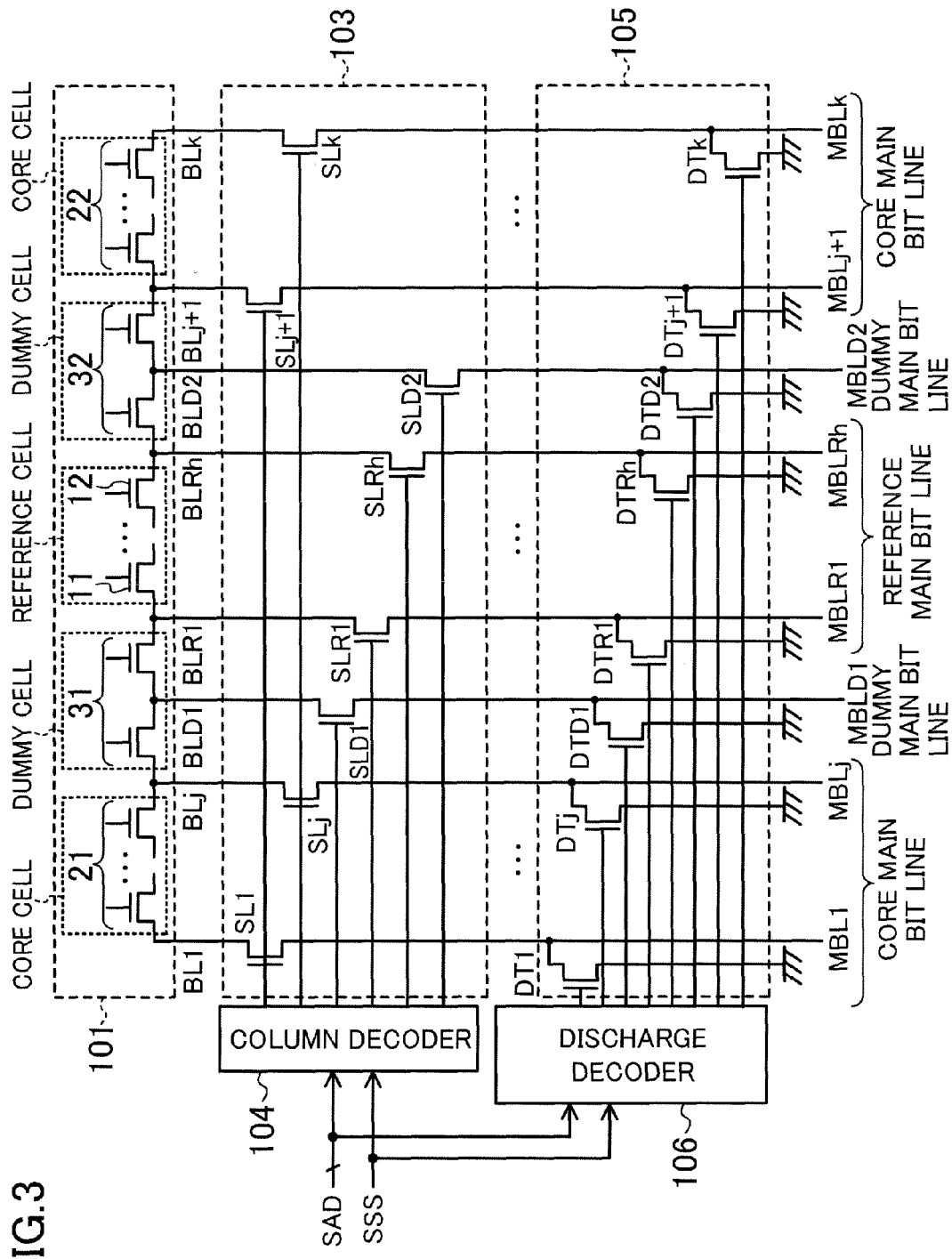
FIG. 3 is a view illustrating an example configuration of a main part of the semiconductor memory device according to the first embodiment.

FIG. 3 is a view illustrating an example configuration of a main part of the semiconductor memory device according to the present embodiment. In FIG. 3, the memory cell array 101 is a virtual ground NOR-type flash memory. Reference symbols MBLR1-MBLRh denote reference main bit lines for reference cells, reference symbols MBL1-MBLj, MBLj+1-MBLk denote core main bit lines for core cells, and reference symbols MBLD1, MBLD2 denote dummy main bit lines for dummy cells. The dummy main bit line MBLD1 is disposed between the reference main bit line MBLR1 and the core main bit lines MBL1-MBLj to be adjacent to the reference main bit line MBLR1. The dummy main bit line MBLD2 is disposed between the reference main bit line MBLRh and the core main bit lines MBLj+1-MBLk to be adjacent to the reference main bit line MBLRh. In the selection transistor circuit 103, selection transistors SL1-SLj, SLj+1-SLk, SLD1, SLD2, SLR1-SLRh are disposed. In the discharge transistor circuit 105, discharge transistors DT1-DTj, DTj+1-DTk, DTD1, DTD2, DTR1-DTRh are disposed.

The reference cells are each connected to a corresponding one of sub bit lines BLR1-BLRh, and the reference main bit lines MBLR1-MBLRh are respectively connected to the sub bit lines BLR1-BLRh via the selection transistors SLR1-SLRh. Moreover, the reference main bit lines MBLR1-

MBLRh are connected to ground respectively via the discharge transistors DTR1-DTRh. That is, a reference cell 11 is connected to the reference main bit line MBLR1 serving as a first main bit line via the selection transistor SLR1 serving as a first selection transistor, and a reference cell 12 serving as a second reference cell is connected to the reference main bit line MBLRh serving as a fourth main bit line via the selection transistor SLRh serving as a fourth selection transistor. The reference main bit line MBLR1 is connected to ground via the discharge transistor DTR1 serving as a first discharge transistor, and the reference main bit line MBLRh is connected to ground via the discharge transistor DTRh serving as a fourth discharge transistor.

The core cells are each connected to corresponding one of sub bit lines BL1-BLj, BLj+1-BLk, and the core main bit lines MBL1-MBLj, MBLj+1-MBLk are connected to the sub bit lines BL1-BLj, BLj+1-BLk via the selection transistors SL1-SLj, SLj+1-SLk. Moreover, the core main bit lines MBL1-MBLj, MBLj+1-MBLk are connected to ground respectively via the discharge transistors DT1-DTj, DTj+1-DTk. That is, a plurality of core cells 21 are connected to the core main bit lines MBL1-MBLj serving as second main bit lines via the selection transistors SL1-SLj serving as second selection transistors, and a plurality of core cells 22 serving as a plurality of second core cells are connected to the core main bit lines MBLj+1-MBLk serving as fifth main bit lines via the selection transistors SLj+1-SLk serving as fifth selection transistors. The core main bit lines MBL1-MBLj are connected to ground via the discharge transistors DT1-DTj serving as second discharge transistors, and the core main bit lines MBLj+1-MBLk are connected to ground via the discharge transistors DTj+1-DTk serving as fifth discharge transistors.

The dummy cells are each connected to corresponding one of sub bit lines BLD1, BLD2, and the dummy main bit lines MBLD1, MBLD2 are respectively connected to the sub bit lines BLD1, BLD2 via the selection transistors SLD1, SLD2. Moreover, the dummy main bit lines MBLD1, MBLD2 are connected to ground respectively via the discharge transistors DTD1, DTD2. That is, a dummy cell 31 serving as a third memory cell is connected to the dummy main bit line MBLD1 serving as a third main bit line disposed between the first main bit line and the second main bit lines via the selection transistor SLD1 serving as a third selection transistor, and a dummy cell 32 serving as a sixth memory cell is connected to the dummy main bit line MBLD2 serving as a sixth main bit line disposed between the fourth main bit line and the fifth main bit lines via the selection transistor SLD2 serving as a sixth selection transistor. The dummy main bit line MBLD1 is connected to ground via the discharge transistor DTD1 serving as a third discharge transistor, and the dummy main bit line MBLD2 is connected to ground via the discharge transistor DTD2 serving as a sixth discharge transistor. The dummy cell 31 is disposed to be adjacent to the reference cell 11, and the dummy cell 32 is disposed to be adjacent to the reference cell 12.

The selection transistors SL1-SLj, SLj+1-SLk, SLD1, SLD2, SLR1-SLRh are transistors configured to electrically connect the main bit lines to the sub bit lines when in a conductive state, and electrically disconnect the main bit lines from the sub bit lines when in a non-conductive state. Gate terminals of the selection transistors SL1-SLj, SLj+1-SLk, SLD1, SLD2, SLR1-SLRh are connected to the column decoder 104. Through gate control by the column decoder 104, the selection transistors SL1-SLj, SLj+1-SLk, SLD1, SLD2, SLR1-SLRh are set to the conductive state or the non-conductive state. The column decoder 104 receives an address signal SAD for selecting a column of the memory cell array 101, and a shield selection signal SSS for controlling the shield operation.

The discharge transistors DT1-DTj, DTj+1-DTk, DTD1, DTD2, DTR1-DTRh are transistors configured to connect the main bit lines to ground when in the conductive state, thereby bringing the main bit lines to ground potential. Gate terminals of the discharge transistors DT1-DTj, DTj+1-DTk, DTD1, DTD2, DTR1-DTRh are connected to the discharge decoder 106. Through gate control by the discharge decoder 106, the discharge transistors DT1-DTj, DTj+1-DTk, DTD1, DTD2, DTR1-DTRh are set to the conductive state or the non-conductive state. The discharge decoder 106 receives the address signal SAD and the shield selection signal SSS. The discharge transistor DTD1 and the discharge decoder 106 form a shield grounding section capable of setting the dummy main bit line MBLD1 to the ground potential according to the shield selection signal SSS. The discharge transistor DTD2 and the discharge decoder 106 form a second shield grounding section capable of setting the dummy main bit line MBLD2 to the ground potential according to the shield selection signal SSS.

Here, the selection transistors SLD1, SLD2 are connected to the column decoder 104, and are electrically isolated from the other selection transistors. The column decoder 104 can independently set, according to the shield selection signal SSS, only the selection transistor SLD1 or SLD2 to the conductive state or the non-conductive state. The discharge transistors DTD1, DTD2 are connected to the discharge decoder 106, and are electrically isolated from the other discharge transistors. The discharge decoder 106 can independently set, according to the shield selection signal SSS, only the discharge transistor DTD1 or DTD2 to the conductive state or the non-conductive state.

In the configuration of FIG. 3, operation to access a core cell will be described. Here, the reference cell 11 connected to the reference main bit line MBLR1 is used, and of the plurality of core cells 21, a core cell connected to the core main bit line MBL1 is accessed.

First, the selection transistor SLD1 is set to the non-conductive state by the column decoder 104 based on the shield selection signal SSS. Then, the discharge transistor DTD1 is set to the conductive state by the discharge decoder 106 based on the shield selection signal SSS, thereby bringing the dummy main bit line MBLD1 to the ground potential. Thus, the dummy main bit line MBLD1 can be used as a shield line with respect to the reference main bit line MBLR1. Likewise, the selection transistor SLD2 is set to the non-conductive state by the column decoder 104 based on the shield selection signal SSS, and the discharge transistor DTD2 is set to the conductive state by the discharge decoder 106 based on the shield selection signal SSS, thereby bringing the dummy main bit line MBLD2 to the ground potential. Thus, the dummy main bit line MBLD2 can be used as a shield line with respect to the reference main bit line MBLRh. Even when the core cell main bit lines MBL1-MBLj, MBLj+1-MBLk are accessed, it is possible to prevent the reference main bit lines MBLR1, MBLRh from being influenced by the parasitic capacitance between the main bit lines.

Moreover, here, the selection transistors SLD1, SLD2 are in the non-conductive state, and thus the sub bit lines BLD1, BLD2 connected to the dummy cells are not brought to the ground potential. Thus, a current flow from the memory cell array 101 to the dummy main bit lines MBLD1, MBLD2 through the sub bit lines BLD1, BLD2 can be prevented.

Next, the column decoder 104 and the discharge decoder 106 set the selection transistor SLR1 to the conductive state and the discharge transistor DTR1 to the non-conductive state based on the address signal SAD. Moreover, the selection transistor SL1 is set to the conductive state, and the discharge transistor DT1 is set to the non-conductive state. The sense amplifier performs comparison between the currents or the voltages of the core cell main bit line MBL1 and the reference main bit line MBLR1, and determines whether data is "0" or "1." When access to the memory cell is terminated, the discharge transistors DT1, DTR1 are set to the conductive state, thereby bringing the core main bit line MBL1 and the reference main bit line MBLR1 to the ground potential.

As described above, in the operation of accessing a core cell, the dummy bit main bit line MBLD1 serves as a shield line of the reference main bit line MBLR1. Moreover, the dummy bit main bit line MBLD2 serves as a shield line of the reference main bit line MBLRh. Thus, a shield of the reference main bit line can be obtained without providing a new shield line, that is, without increasing the area of the semiconductor memory device.

Note that in the configuration of FIG. 3, accessing a dummy cell is also possible. For example, the reference cell connected to the reference main bit line MBLRh is used to access the dummy cell connected to the dummy main bit line MBLD1. In this case, the column decoder 104 sets the selection transistors SLD1, SLRh to the conductive state, and the discharge decoder 106 sets the discharge transistors DTD1, DTRh to the non-conductive state. The sense amplifier performs comparison between the currents or the voltages of the dummy main bit line MBLD1 and the reference main bit line MBLRh, and determines whether data is "0" or "1." When access to the memory is terminated, the discharge decoder 106 sets the discharge transistors DTD1, DTRh to the conductive state.

However, when a dummy cell is accessed as in the above-described case, no shield is formed between the reference main bit line and the dummy main bit line. Thus, due to the parasitic capacitance between the main bit lines, the reference main bit line is influenced by the dummy main bit line, which causes variations in the reference current value and the reference voltage value, so that it may not be possible for the sense amplifier to properly determine whether data is "0" or "1." However, this can be overcome by limiting the use of the dummy cells.

Between the main bit lines, except between the dummy main bit line and the reference main bit line, that is, between the reference main bit lines, between the core main bit lines, and between the dummy main bit line and the core main bit line, no shield is generally required because the main bit lines adjacent to each other are not simultaneously selected.

Figure 4:
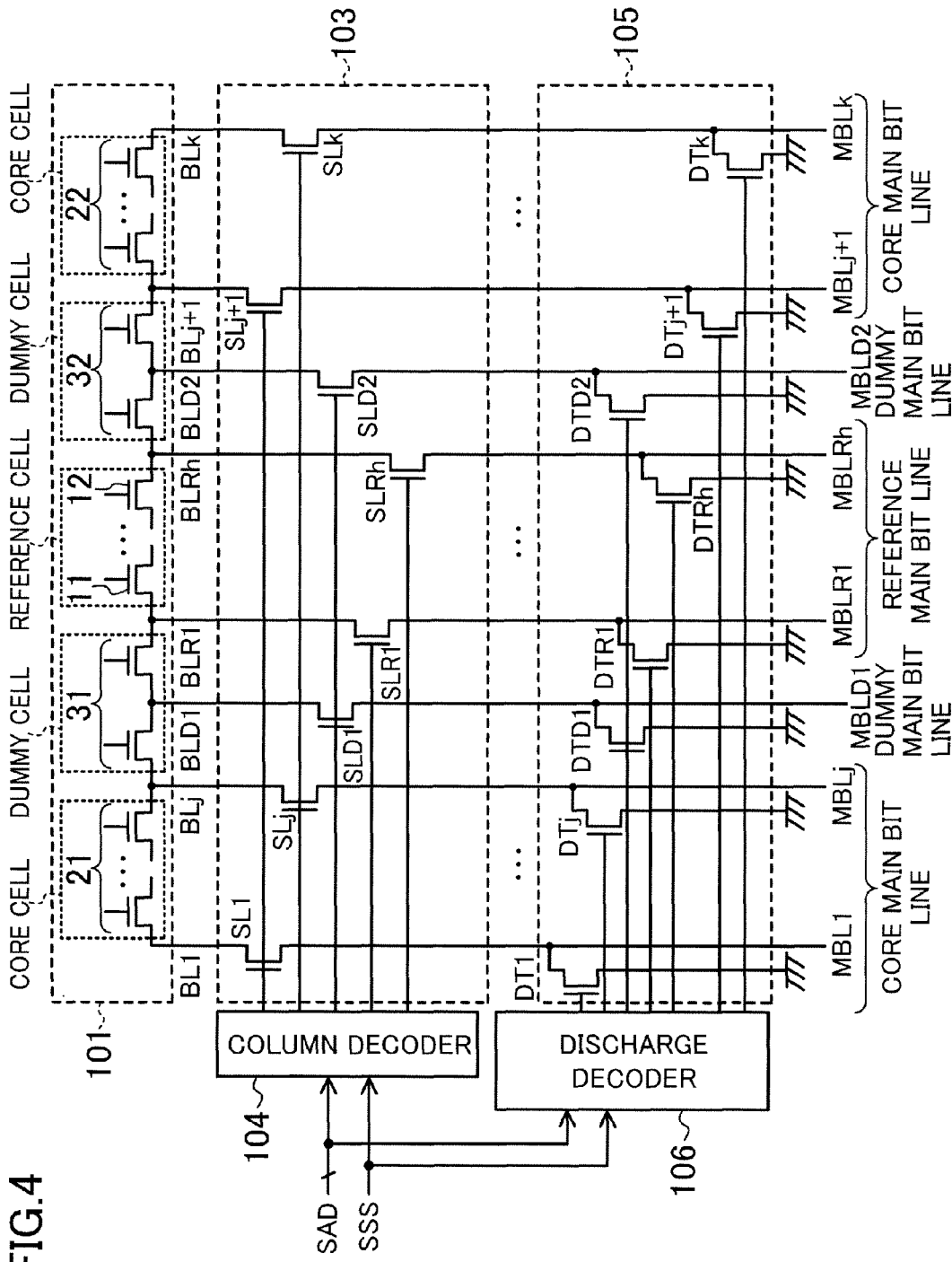
FIG. 4 is a view illustrating another example configuration of the main part of the semiconductor memory device according to the first embodiment.

FIG. 4 illustrates another example configuration of the main components of the semiconductor memory device according to the present embodiment. The configuration of FIG. 4 is almost similar to that of FIG. 3, the same reference numerals as those shown in FIG. 3 are used to represent equivalent elements, and the description thereof is omitted.

The configuration of FIG. 4 is different from that of FIG. 3 in that the gate terminals of the selection transistors SLD1, SLD2 respectively connected to the dummy main bit lines MBLD1, MBLD2 are commonly connected to the column decoder 104, and the gate terminals of the discharge transistors DTD1, DTD2 respectively connected to the dummy main bit lines MBLD1, MBLD2 are commonly connected to the discharge decoder 106. The expression "commonly connected" means that gate terminals of transistors are connected by one line.

In this case, the conductive/non-conductive states of the selection transistors SLD1, SLD2 are controlled in the same manner by the column decoder 104, and the conductive/non-conductive states of the discharge transistors DTD1, DTD2 are controlled in the same manner by the discharge decoder 106. That is, the dummy main bit lines MBLD1, MBLD2 are set to the ground potential at the same timing.

The configuration of FIG. 4 also provides advantages similar to those of the configuration of FIG. 3. In addition, the number of control lines from the column decoder 104 and the discharge decoder 106 can be reduced.

Second Embodiment

A semiconductor memory device according to a second embodiment is similar to that of the first embodiment in terms of circuit configuration in the periphery of a memory cell array. However, a configuration of the memory cell array of the second embodiment is different from that of the first embodiment.

Figure 5A:
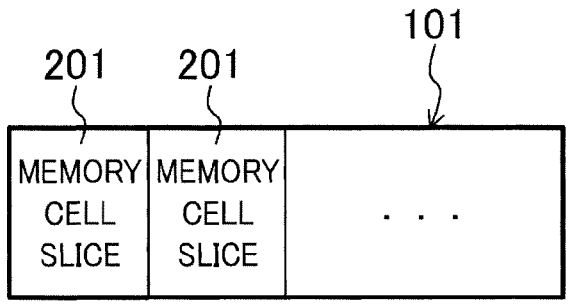
FIGS. 5A, 5B and 5C are views schematically illustrating a configuration of a memory cell array in a semiconductor memory device according to a second embodiment.
Figure 5B:
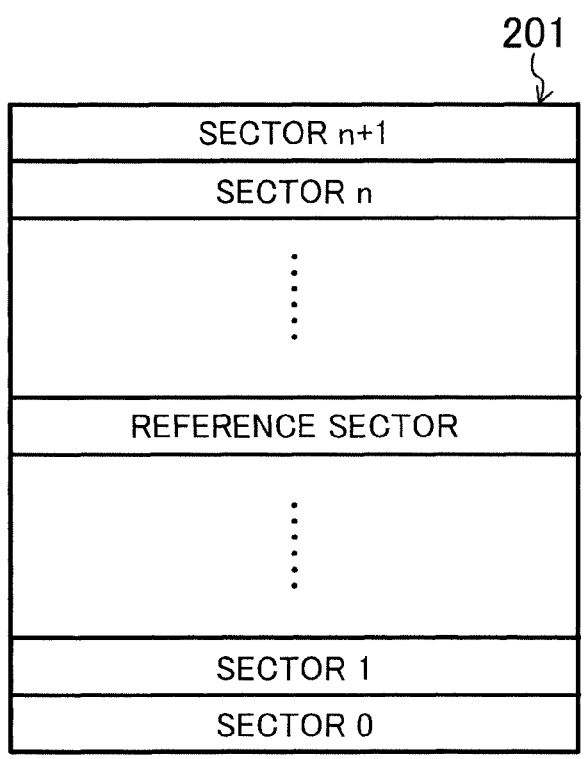
Figure 5C:
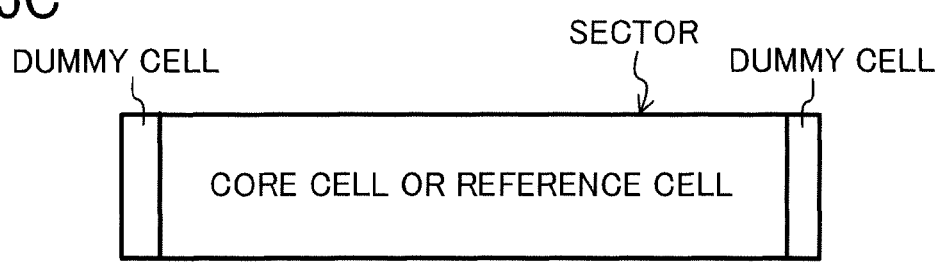

FIGS. 5A, 5B, and 5C schematically illustrate the configuration of the memory cell array in the semiconductor memory device according to the second embodiment. As illustrated in FIG. 5A, a memory cell array 101 includes a plurality of slices 201. The memory cell array 101 is divided into slices 201 along a bit line direction, and word lines are backed between the slices 201. A configuration of the slice 201 is illustrated in FIG. 5B. As illustrated in FIG. 5B, the slice 201 includes a plurality of sectors, and one or more of the sectors are reference sectors including reference cells. Other sectors include core cells in which data is stored by a user. A configuration of the sector is illustrated in FIG. 5C. As illustrated in FIG. 5C, dummy cells are disposed at ends of each sector in order to maintain process stability. In a reference sector, memory cells other than dummy cells are used as reference cells, and in a sector including core cells, memory cells other than dummy cells are used as the core cells.

Figure 6:
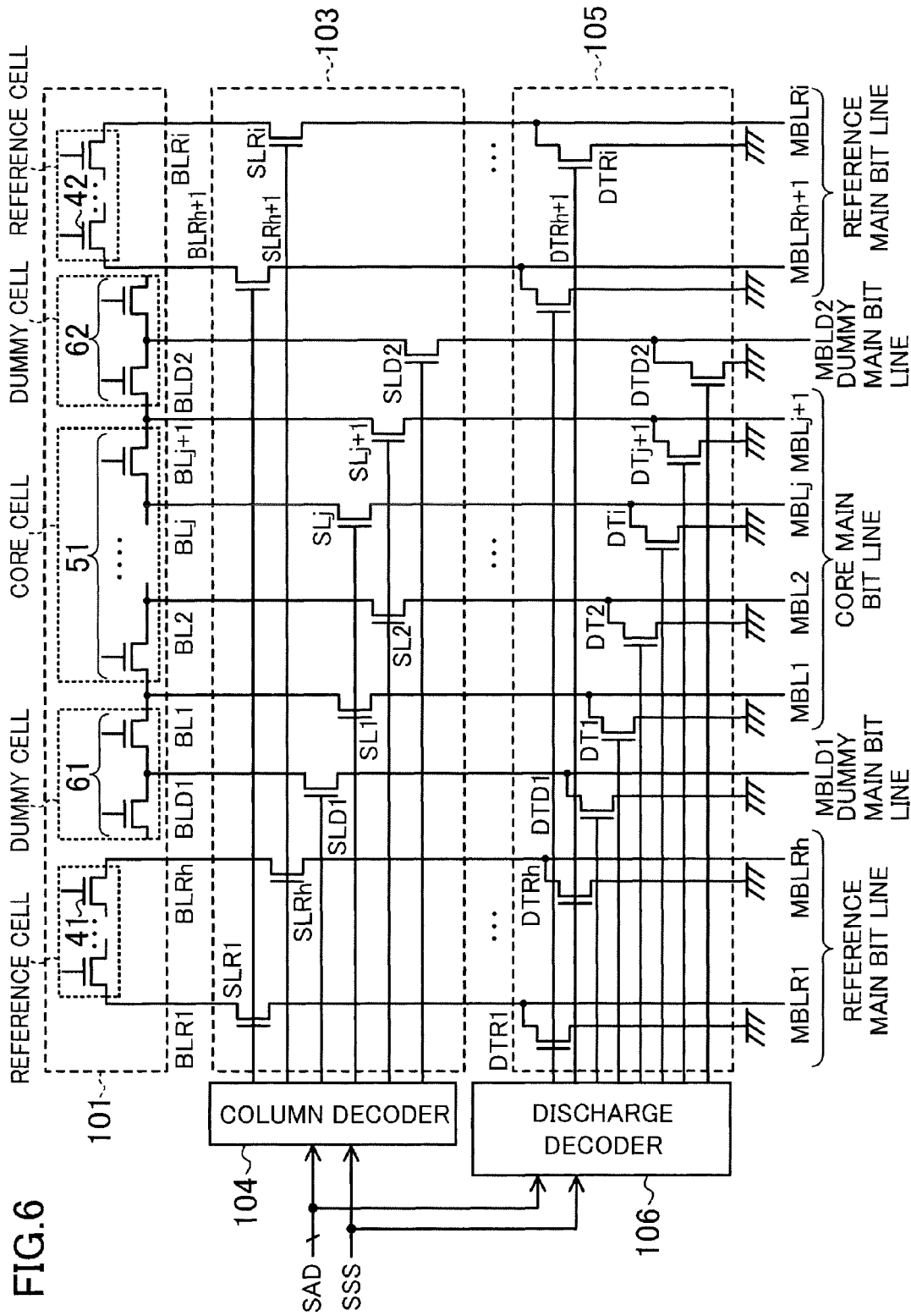
FIG. 6 is a view illustrating an example configuration of a main part of the semiconductor memory device according to the second embodiment.

FIG. 6 is a view illustrating an example configuration of a main part of the semiconductor memory device according to the present embodiment. In FIG. 6, the memory cell array 101 has a virtual ground type configuration. In FIG. 6, core cells in a sector, dummy cells disposed at ends of the sector, and reference cells in reference sectors are shown. Reference symbols MBLR1-MBLRh, MBLRh+1-MBLRi denote reference main bit lines for reference cells, reference symbols MBL1-MBLj+1 denote core main bit lines for core cells, and reference symbols MBLD1, MBLD2 denote dummy main bit lines for dummy cells. The dummy main bit line MBLD1 is disposed between the reference main bit line MBLRh and the core main bit lines MBL1-MBLj+1 to be adjacent to the reference main bit line MBLRh. The dummy main bit line MBLD2 is disposed between the reference main bit line MBLRh+1 and the core main bit lines MBL1-MBLj+1 to be adjacent to the reference main bit line MBLRh+1. In a selection transistor circuit 103, selection transistors SL1-SLj+1, SLD1, SLD2, SLR1-SLRh, SLRh+1-SLRi are disposed. In a discharge transistor circuit 105, discharge transistors DT1-DTj+1, DTD1, DTD2, DTR1-DTRh, DTRh+1-DTRi are disposed.

The reference cells are each connected to a corresponding one of sub bit lines BLR1-BLRh, BLRh+1-BLRi. The reference main bit lines MBLR1-MBLRh are respectively connected to the sub bit lines BLR1-BLRh via the selection transistors SLR1-SLRh, and the reference main bit lines MBLRh+1-MBLRi are connected to the sub bit lines BLRh+1-BLRi via the selection transistors SLRh+1-SLRi. Moreover, the reference main bit lines MBLR1-MBLRh are connected to ground respectively via the discharge transistors DTR1-DTRh, and the reference main bit lines MBLRh+1-MBLRi are connected to ground respectively via the discharge transistors DTRh+1-DTRi. That is, a reference cell 41 is connected to the reference main bit line MBLRh serving as a first main bit line via the selection transistor SLRh serving as a first selection transistor, and a reference cell 42 serving as a second reference cell is connected to the reference main bit line MBLRh+1 serving as a fourth main bit line via the selection transistor SLRh+1 serving as a fourth selection transistor. The reference main bit line MBLRh is connected to ground via the discharge transistor DTRh serving as a first discharge transistor, and the reference main bit line MBLRh+1 is connected to ground via the discharge transistor DTRh+1 serving as a fourth discharge transistor.

The core cells are each connected to corresponding one of sub bit lines BL1-BLj+1, and the core main bit lines MBL1-MBLj+1 are connected to the sub bit lines BL1-BLj+1 via the selection transistors SL1-SLj+1. Moreover, the core main bit lines MBL1-MBLj+1 are connected to ground respectively via the discharge transistors DT1-DTj+1. That is, a plurality of core cells (or a plurality of second core cells) 51 are connected to the core main bit lines MBL1-MBLj+1 serving as second or fifth main bit lines via the selection transistors SL1-SLj+1 serving as second or fifth selection transistors. The core main bit lines MBL1-MBLj+1 are connected to ground via the discharge transistors DT1-DTj+1 serving as second or fifth discharge transistors.

The dummy cells are each connected to corresponding one of sub bit lines BLD1, BLD2, and the dummy main bit lines MBLD1, MBLD2 are respectively connected to the sub bit lines BLD1, BLD2 via the selection transistors SLD1, SLD2. Moreover, the dummy main bit lines MBLD1, MBLD2 are connected to ground respectively via the discharge transistors DTD1, DTD2. That is, a dummy cell 61 serving as a third memory cell is connected to the dummy main bit line MBLD1 serving as a third main bit line disposed between the first main bit line and the second main bit lines via the selection transistor SLD1 serving as a third selection transistor, and a dummy cell 62 serving as a sixth memory cell is connected to the dummy main bit line MBLD2 serving as a sixth main bit line disposed between the fourth main bit line and the fifth main bit lines via the selection transistor SLD2 serving as a sixth selection transistor. The dummy main bit line MBLD1 is connected to ground via the discharge transistor DTD1 serving as a third discharge transistor, and the dummy main bit line MBLD2 is connected to ground via the discharge transistor DTD2 serving as a sixth discharge transistor.

The selection transistors SL1-SLj+1, SLD1, SLD2, SLR1-SLRh, SLRh+1, SLRi are transistors configured to electrically connect the main bit lines to the sub bit lines when in a conductive state, and electrically disconnect the main bit lines from the sub bit lines when in a non-conductive state. Gate terminals of the selection transistors SL1-SLj+1, SLD1, SLD2, SLR1-SLRh, SLRh+1, SLRi are connected to a column decoder 104. Through gate control by the column decoder 104, the selection transistors SL1-SLj+1, SLD1, SLD2, SLR1-SLRh, SLRh+1, SLRi are set to the conductive state or the non-conductive state. The column decoder 104 receives an address signal SAD and a shield selection signal SSS.

The discharge transistors DT1-DTj+1, DTD1, DTD2, DTR1-DTRh, DTRh+1-DTRi are transistors configured to connect the main bit lines to ground when in the conductive state, thereby bringing the main bit lines to ground potential. Gate terminals of the discharge transistors DT1-DTj+1, DTD1, DTD2, DTR1-DTRh, DTRh+1-DTRi are connected to a discharge decoder 106. Through gate control by the discharge decoder 106, the discharge transistors DT1-DTj+1, DTD1, DTD2, DTR1-DTRh, DTRh+1-DTRi are set to the conductive state or the non-conductive state. The discharge decoder 106 receives the address signal SAD and the shield selection signal SSS. The discharge transistor DTD1 and the discharge decoder 106 form a shield grounding section capable of setting the dummy main bit line MBLD1 to the ground potential according to the shield selection signal SSS. The discharge transistor DTD2 and the discharge decoder 106 form a second shield grounding section capable of setting the dummy main bit line MBLD2 to the ground potential according to the shield selection signal SSS.

Here, the selection transistors SLD1, SLD2 are connected to the column decoder 104, and are electrically isolated from the other selection transistors. The column decoder 104 can independently set, according to the shield selection signal SSS, only the selection transistor SLD1 or SLD2 to the conductive state or the non-conductive state. The discharge transistors DTD1, DTD2 are connected to the discharge decoder 106, and are electrically isolated from the other discharge transistors. The discharge decoder 106 can independently set, according to the shield selection signal SSS, only the discharge transistor DTD1 or DTD2 to the conductive state or the non-conductive state.

In the configuration of FIG. 6, operation to access a core cell will be described. Here, the reference cell 41 connected to the reference main bit line MBLRh is used, and of the plurality of core cells 51, a core cell connected to the core main bit line MBL1 is accessed.

First, the selection transistor SLD1 is set to the non-conductive state by the column decoder 104 based on the shield selection signal SSS. Then, the discharge transistor DTD1 is set to the conductive state by the discharge decoder 106 based on the shield selection signal SSS, thereby bringing the dummy main bit line MBLD1 to the ground potential. Thus, the dummy main bit line MBLD1 can be used as a shield line with respect to the reference main bit line MBLRh. Likewise, the selection transistor SLD2 is set to the non-conductive state by the column decoder 104 based on the shield selection signal SSS, and the discharge transistor DTD2 is set to the conductive state by the discharge decoder 106 based on the shield selection signal SSS, thereby bringing the dummy main bit line MBLD2 to the ground potential. Thus, the dummy main bit line MBLD2 can be used as a shield line with respect to the reference main bit line MBLRh+1. Even when the core cell main bit lines MBL1-MBLj+1 are accessed, it is possible to prevent the reference main bit lines MBLRh, MBLRh+1 from being influenced by the parasitic capacitance between the main bit lines.

Moreover, here, the selection transistors SLD1, SLD2 are in the non-conductive state, and thus the sub bit lines BLD1, BLD2 connected to the dummy cells are not brought to the ground potential. Thus, a current flow from the memory cell array 101 to the dummy main bit lines MBLD1, MBLD2 through the sub bit lines BLD1, BLD2 can be prevented.

Next, the column decoder 104 and the discharge decoder 106 set the selection transistor SLRh to the conductive state and the discharge transistor DTRh to the non-conductive state based on the address signal SAD. Moreover, the selection transistor SL1 is set to the conductive state, and the discharge transistor DT1 is set to non-conductive state. A sense amplifier performs comparison between the currents or the voltages of the core cell main bit line MBL1 and the reference main bit line MBLRh, and determines whether data is "0" or "1." When access to the memory cell is terminated, the discharge transistors DT1, DTRh are set to the conductive state, thereby bringing the core main bit line MBL1 and the reference main bit line MBLRh to the ground potential.

As described above, in the operation of accessing a core cell, the dummy bit main bit line MBLD1 serves as a shield line of the reference main bit line MBLRh. Moreover, the dummy bit main bit line MBLD2 serves as a shield line of the reference main bit line MBLRh+1. Thus, a shield of the reference main bit line can be obtained without providing a new shield line, that is, without increasing the area of the semiconductor memory device.

Note that in the configuration of FIG. 6, accessing a dummy cell is also possible. For example, the reference cell connected to the reference main bit line MBLRi is used to access the dummy cell connected to the dummy main bit line MBLD1. In this case, the column decoder 104 sets the selection transistors SLD1, SLRi to the conductive state, and the discharge decoder 106 sets the discharge transistors DTD1, DTRi to the non-conductive state. The sense amplifier performs comparison between the currents or the voltages of the dummy main bit line MBLD1 and the reference main bit line MBLRi, and determines whether data is "0" or "1." When access to the memory is terminated, the discharge decoder 106 sets the discharge transistors DTD1, DTRi to the conductive state.

However, when a dummy cell is accessed such as in this case, no shield is formed between the reference main bit line and the dummy main bit line. Thus, due to the parasitic capacitance between the main bit lines, the reference main bit line is influenced by the dummy main bit line, which causes variations in the reference current value and the reference voltage value, so that it may not be possible for the sense amplifier to properly determine whether data is "0" or "1." However, this can be overcome by limiting the use of the dummy cells.

Between the main bit lines, except between the dummy main bit line and the reference main bit line, that is, between the reference main bit lines, between the core main bit lines, and between the dummy main bit line and the core main bit line, no shield is generally required because the main bit lines adjacent to each other are not simultaneously selected.

Figure 7:
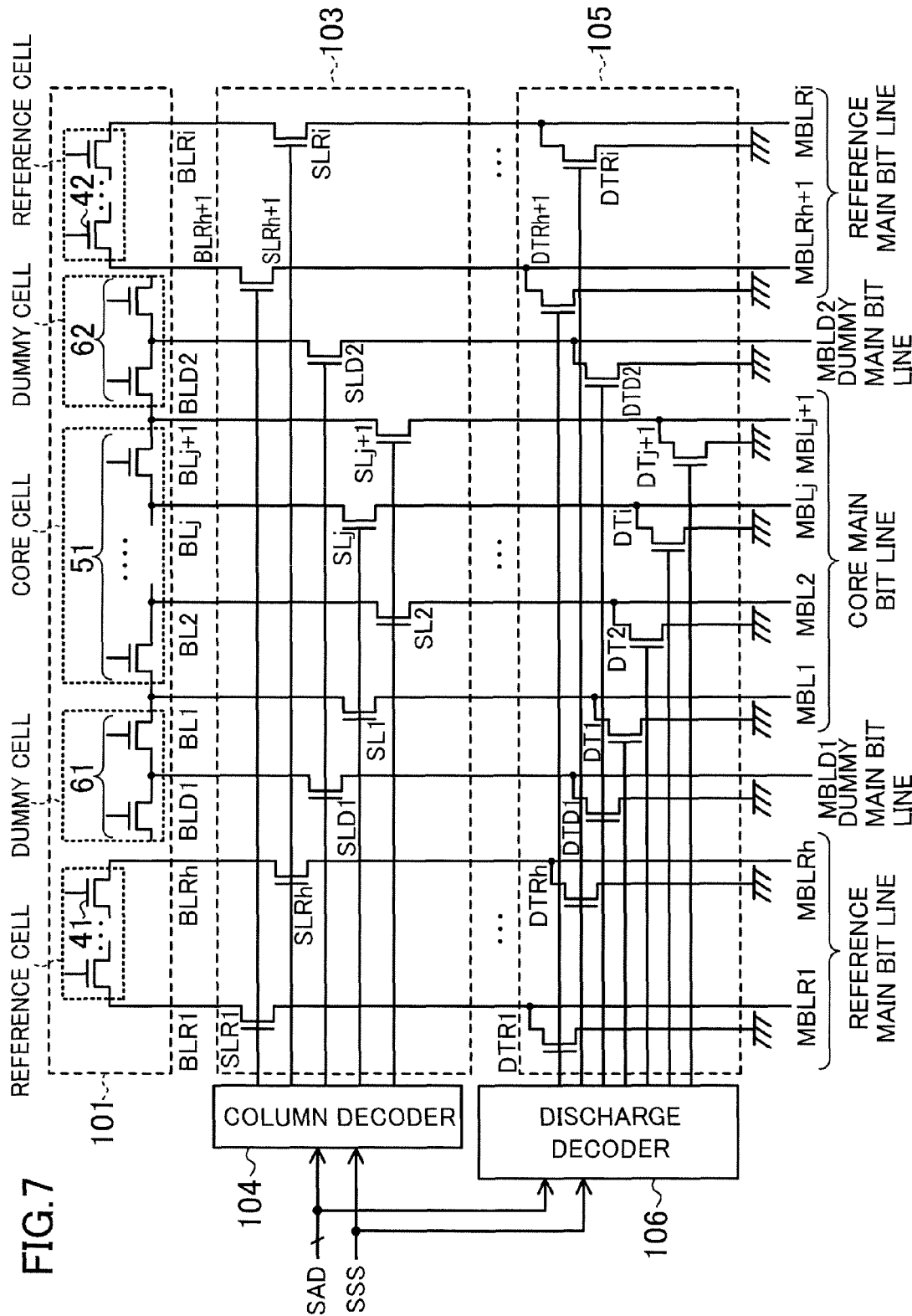
FIG. 7 is a view illustrating another example configuration of the main part of the semiconductor memory device according to the second embodiment.
Figure 8:
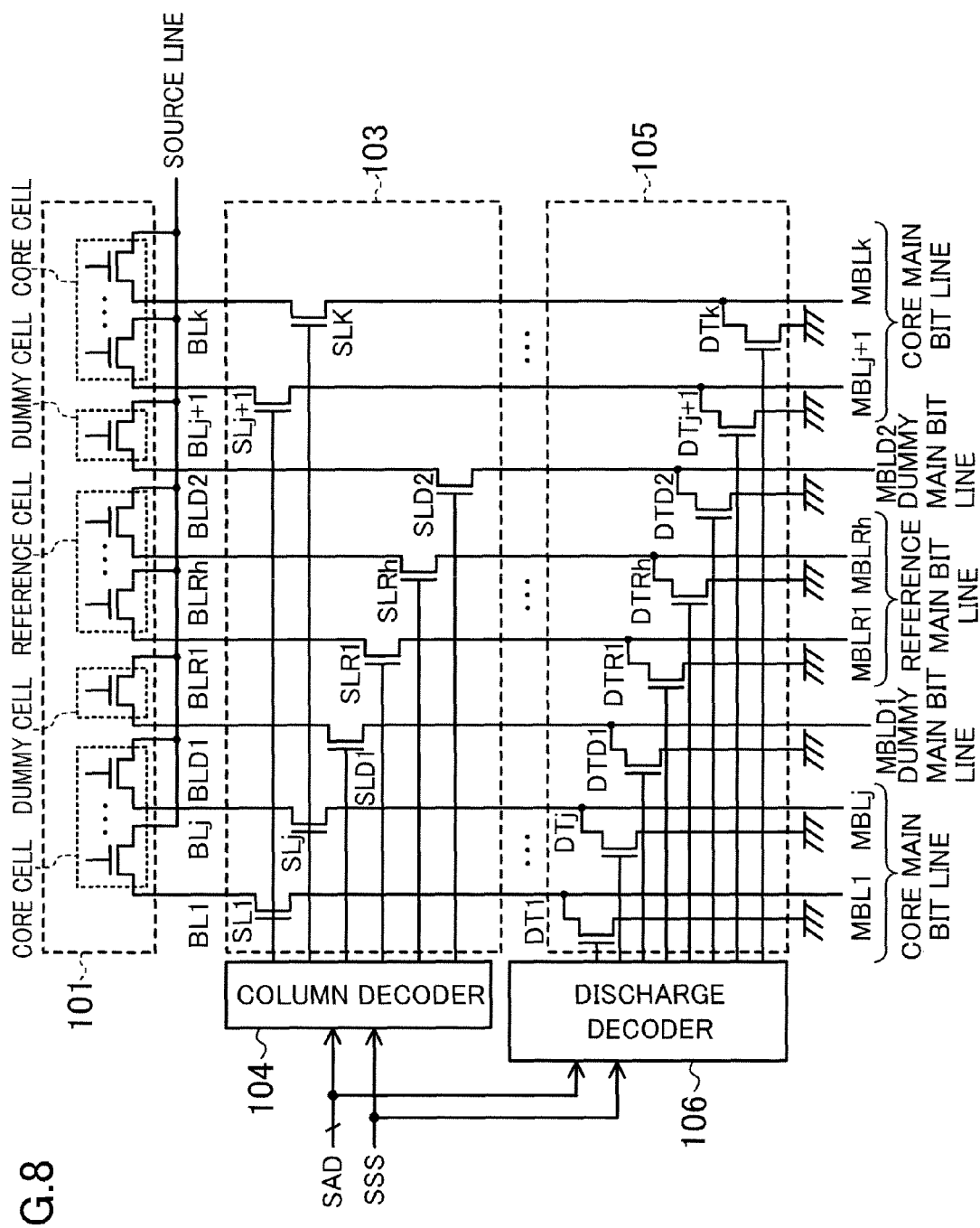
FIG. 8 is a view illustrating an example configuration in which the memory cell array does not have a virtual ground type configuration.

FIG. 7 illustrates another example configuration of the main components of the semiconductor memory device according to the present embodiment. The configuration of FIG. 7 is almost similar to that of FIG. 6, the same reference numerals as those shown in FIG. 6 are used to represent equivalent elements, and the description thereof is omitted.

The configuration of FIG. 7 is different from that of FIG. 6 in that the gate terminals of the selection transistors SLD1, SLD2 respectively connected to the dummy main bit lines MBLD1, MBLD2 are commonly connected to the column decoder 104, and the gate terminals of the discharge transistors DTD1, DTD2 are commonly connected to the discharge decoder 106. The expression "commonly connected" means that gate terminals of transistors are connected by one line.

In this case, the conductive/non-conductive states of the selection transistors SLD1, SLD2 are controlled in the same manner by the column decoder 104 based on the shield selection signal SSS, and the conductive/non-conductive states of the discharge transistors DTD1, DTD2 are also controlled in the same manner by the discharge decoder 106 based on the shield selection signal SSS. That is, the dummy main bit lines MBLD1, MBLD2 are set to the ground potential at the same timing.

The configuration of FIG. 7 also provides advantages similar to those of the configuration of FIG. 6. In addition, the number of control lines from the column decoder 104 and the discharge decoder 106 can be reduced.

The example configurations have been described with a NOR-type flash memory taken as an example, but are useful in other types of flash memory and semiconductor memory devices.

Moreover, in the example configurations described above, the shield grounding section is composed of the discharge transistor and the discharge decoder, but any configuration may be used as long as the main bit line can be selectively set to the ground potential based on the shield selection signal.

Other Example Configurations

In the example configurations described above, the memory cell array has a virtual ground type configuration, but the embodiments described above can likewise be implemented even when the memory cell array does not have the virtual ground type configuration.

FIGS. 8-11 each illustrate an example configuration in which a memory cell array 101 does not have the virtual ground type configuration. That is, in FIGS. 8-11, the drain of each of memory cells is connected to a sub bit line, and the source of each memory cell is connected to a source line. The memory cell array 101 is a NOR-type flash memory.

Figure 9:
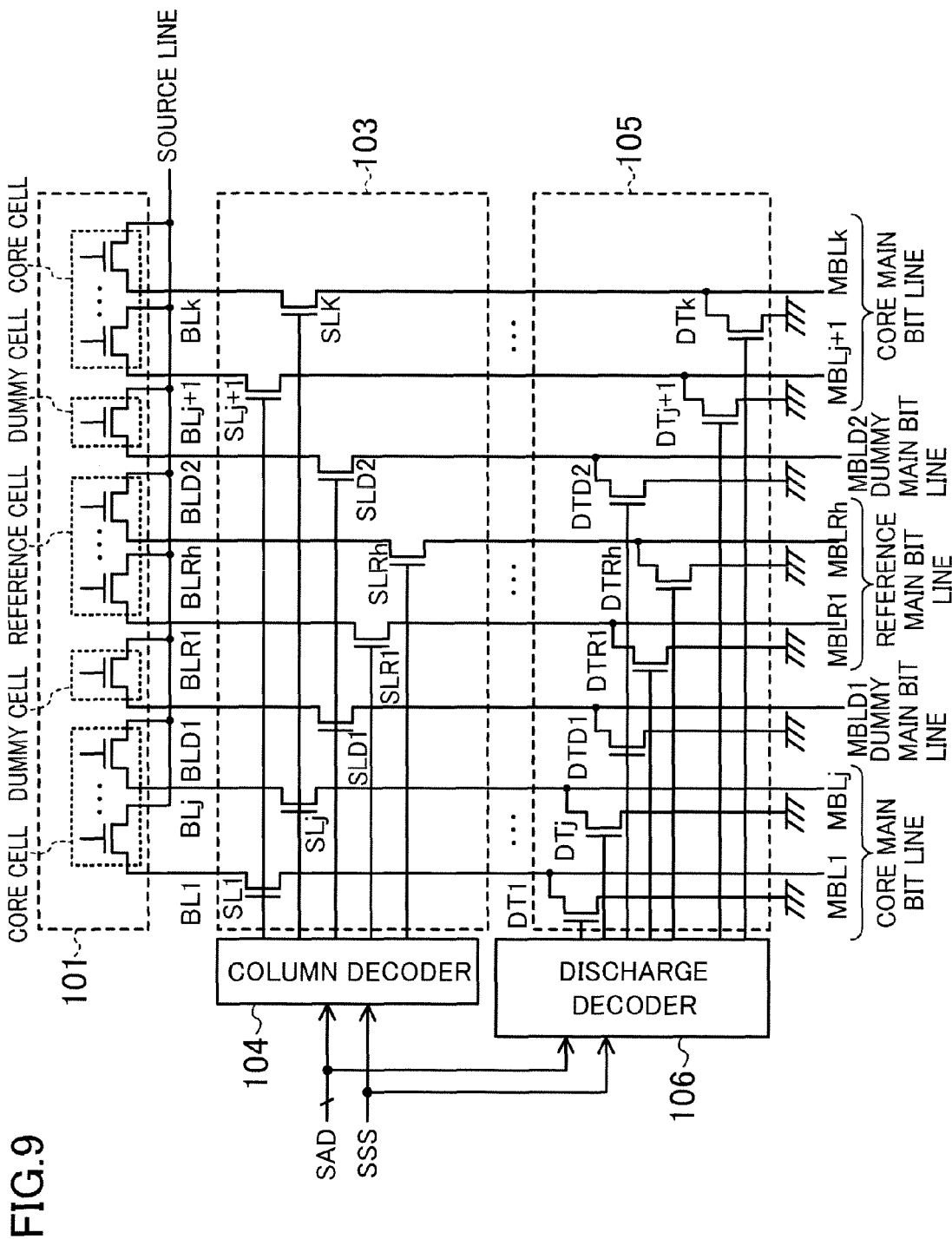
FIG. 9 is a view illustrating an example configuration in which the memory cell array does not have a virtual ground type configuration.
Figure 10:
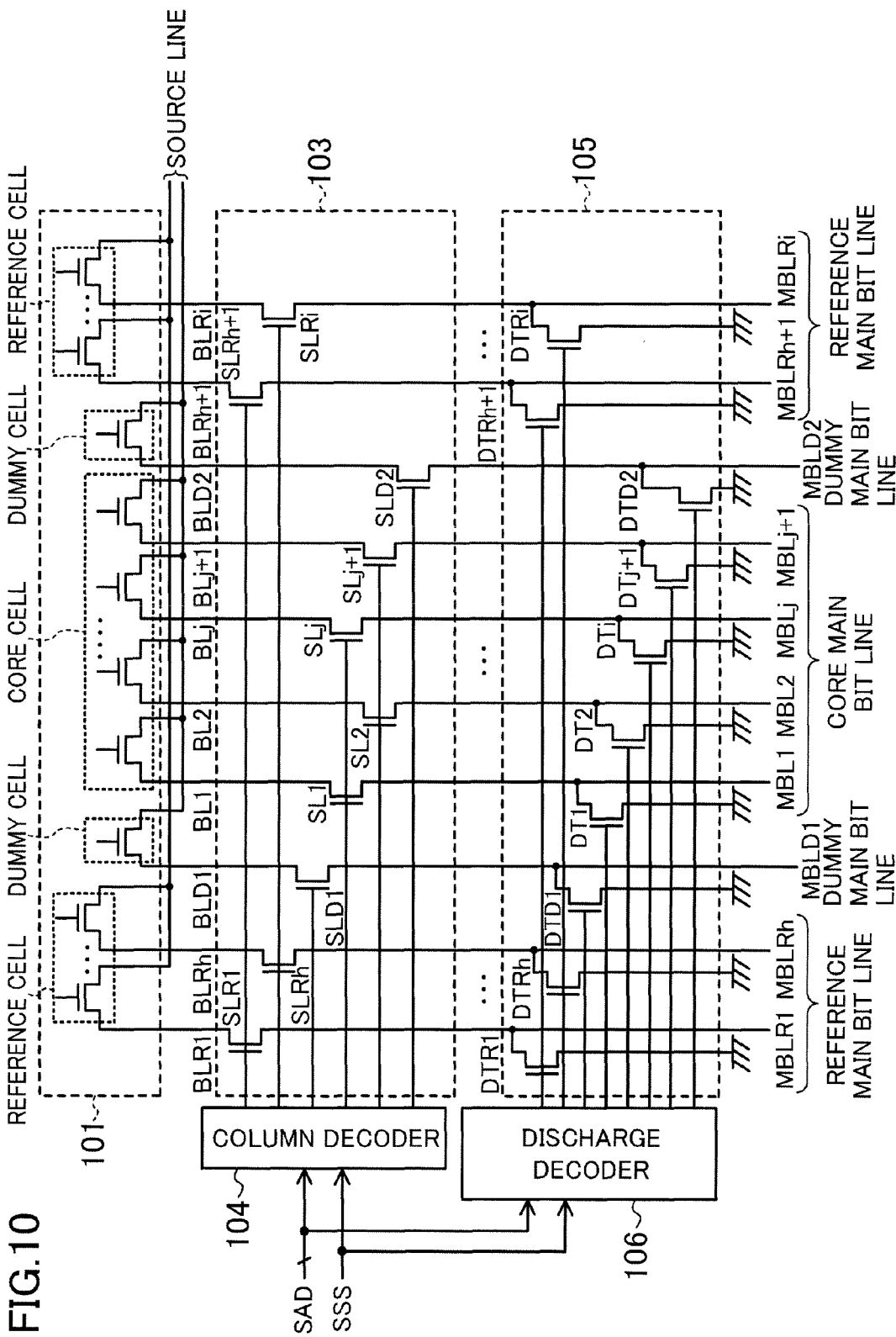
FIG. 10 is a view illustrating an example configuration in which the memory cell array does not have a virtual ground type configuration.
Figure 11:
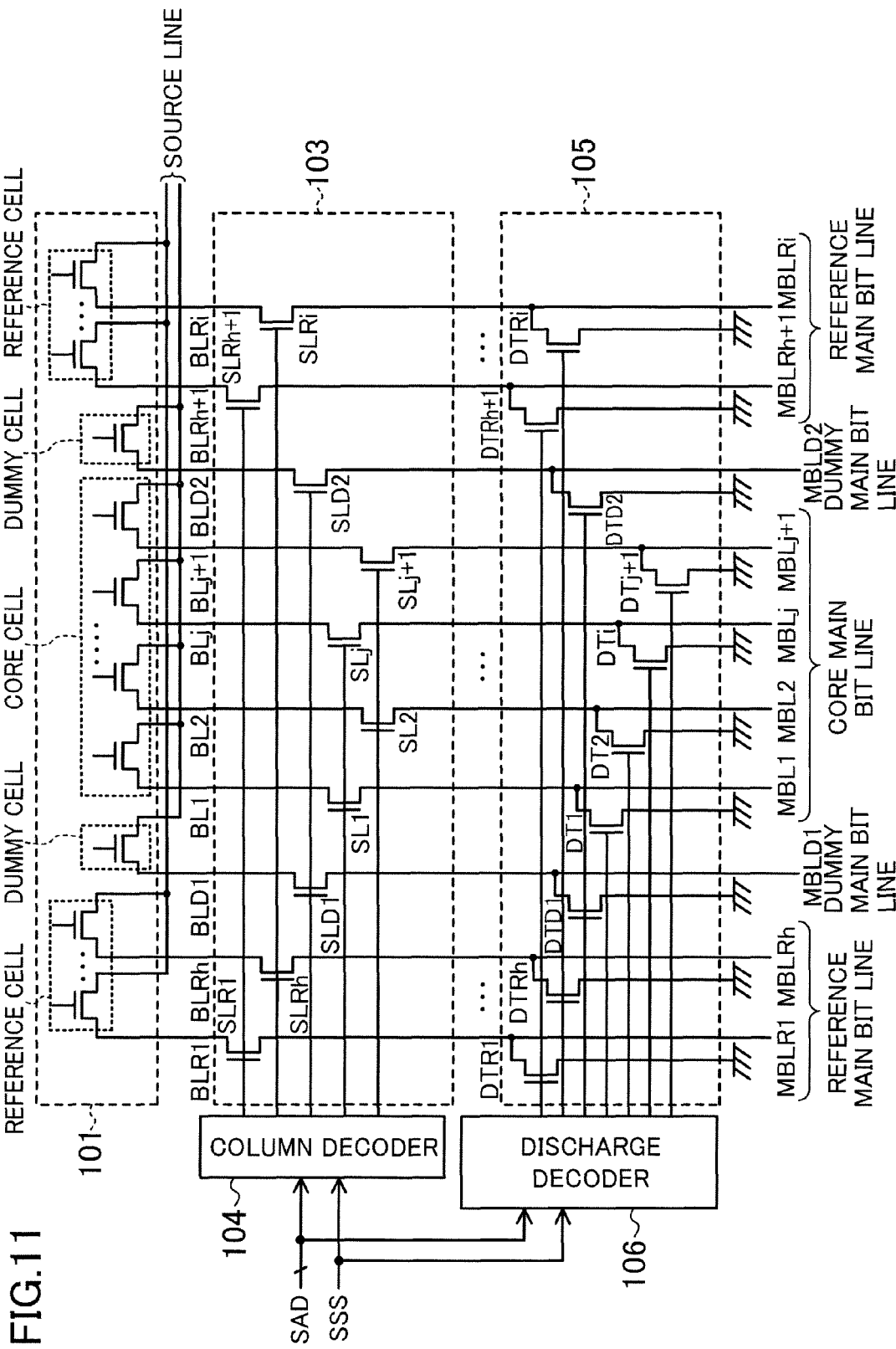
FIG. 11 is a view illustrating an example configuration in which the memory cell array does not have a virtual ground type configuration.

The configurations of FIGS. 8, 9, 10, and 11 are respectively similar to those of FIGS. 3, 4, 6, and 7 except that the memory cell array 101 does not have the virtual ground type configuration. That is, in the configurations in FIG. 8 and FIG. 9, dummy main bit lines MBLD1, MBLD2 can serve as shield lines of reference main bit lines MBLR1, MBLRh. In FIG. 9, gate terminals of selection transistors SLD1, SLD2 are commonly connected to a column decoder 104, and gate terminals of discharge transistors DTD1, DTD2 are commonly connected to a discharge decoder 106. Moreover, in the configurations in FIG. 10 and FIG. 11, dummy main bit lines MBLD1, MBLD2 can serve as shield lines of reference main bit lines MBLRh, MBLRh+1. In FIG. 11, gate terminals of selection transistors SLD1, SLD2 are commonly connected to a column decoder 104, and gate terminals of discharge transistors DTD1, DTD2 are commonly connected to a discharge decoder 106.

Moreover, in the example configurations described above, the dummy main bit lines are used as shield lines, but core cell main bit lines or the reference main bit line may be used as shield lines.

Figure 12:
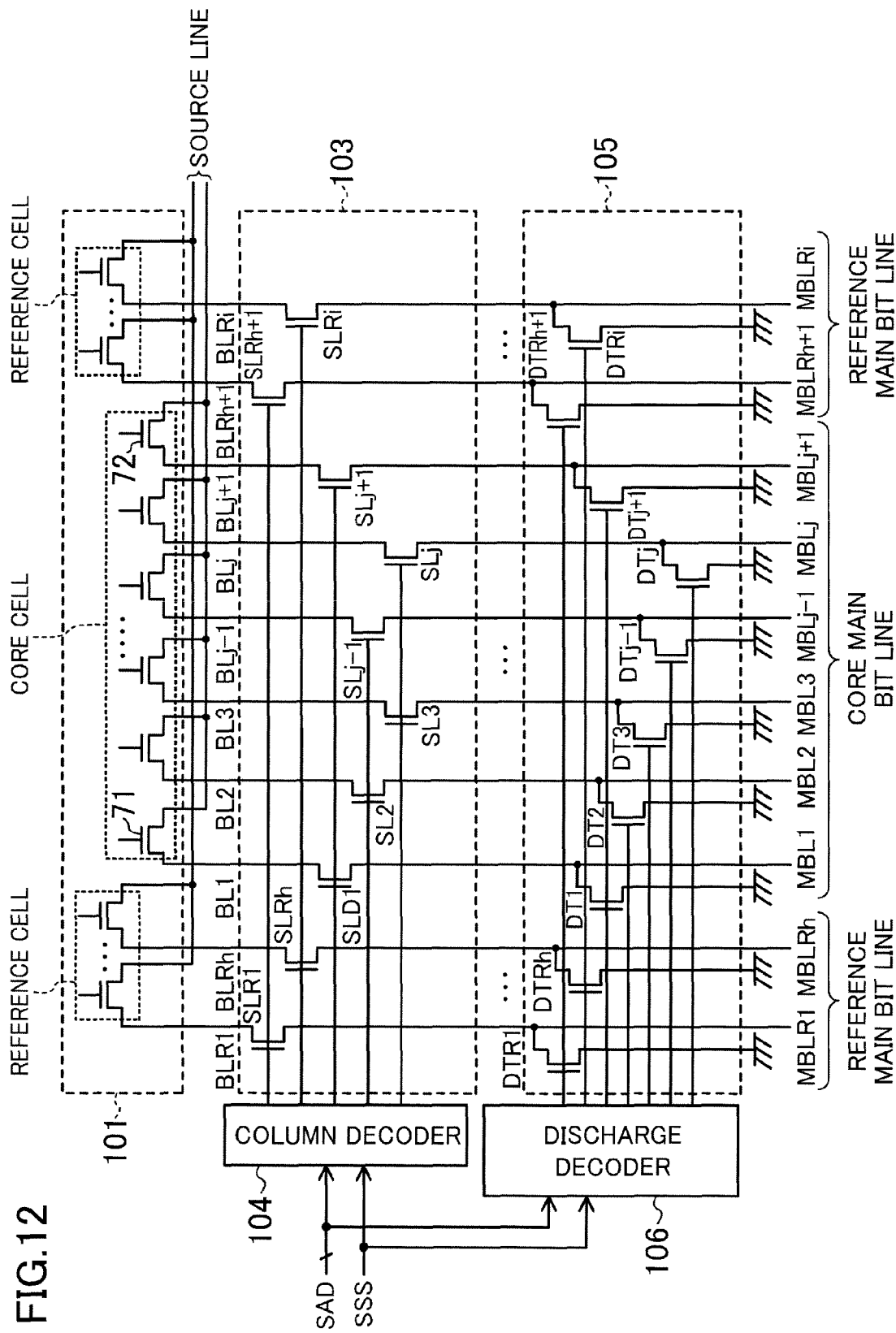
FIG. 12 is a view illustrating an example configuration in which a core main bit line is used as a shield line.

FIG. 12 illustrates an example configuration in which core main bit lines are used as shield lines. In the configuration of FIG. 12, a memory cell array 101 does not include a dummy cell, but includes only core cells and reference cells. Other configurations of FIG. 12 are similar to those of FIG. 11. In the configuration of FIG. 12, core main bit lines MBL1, MBLj+1 which are adjacent to reference main bit lines MBLRh, MBLRh+1, and are disposed for core cells 71, 72 serving as third and sixth memory cells can be used as shield lines in the same manner as the dummy bit lines MBLD1, MBLD2 in the configuration of FIG. 11.

Figure 13:
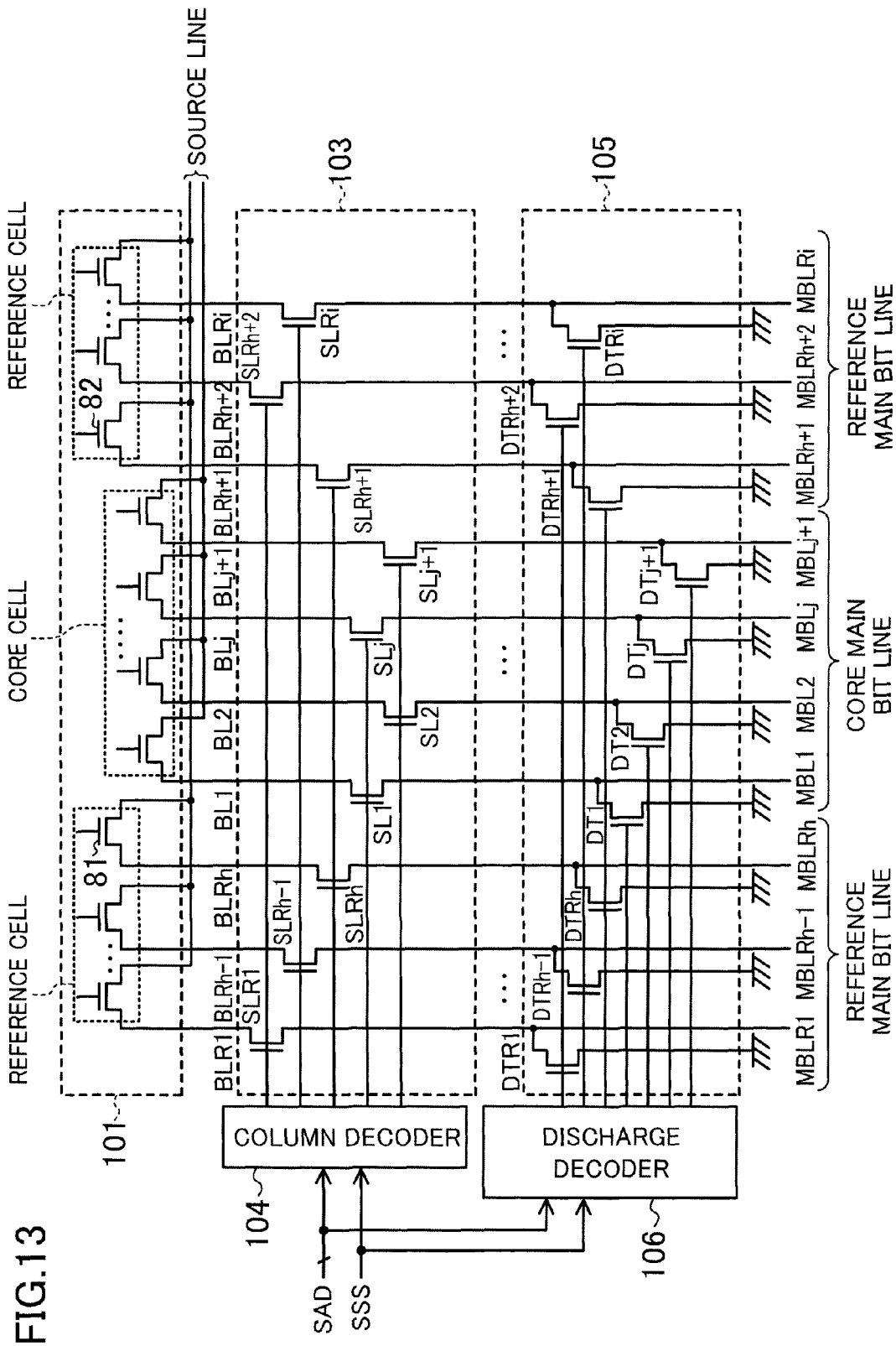
FIG. 13 is a view illustrating an example configuration in which a reference main bit line is used as a shield line.

FIG. 13 illustrates an example configuration in which reference main bit lines are used as shield lines. Also in the configuration of FIG. 13, a memory cell array 101 does not include a dummy cell, but includes only core cells and reference cells. Other configurations of FIG. 13 are similar to those of FIG. 11. In the configuration of FIG. 13, reference main bit lines MBLRh, MBLRh+1 which are adjacent to reference main bit lines MBLRh-1, MBLRh+2, and are disposed for reference cells 81, 82 serving as third and sixth memory cells can be used as shield lines in the same manner as the dummy bit lines MBLD1, MBLD2 in the configuration of FIG. 11.

Note that the other example configurations have been described above with a NOR-type flash memory taken as an example, but the present disclosure is applicable to other types of flash memory and other semiconductor memory devices.

In the present disclosure, a shield of the reference main bit lines can be obtained without disposing a new shield line, so that it is possible to provide semiconductor memory devices having small areas.

What is claimed is:

1. A semiconductor memory device comprising:
a memory cell array including a reference cell, a plurality of core cells, and a third memory cell;
a first main bit line for the reference cell;
second main bit lines for the plurality of core cells;
a third main bit line for the third memory cell, the third main bit line being disposed between the first main bit line and the second main bit lines;
a first selection transistor which is disposed between a reference cell sub bit line connected to the reference cell and the first main bit line, and is configured to electrically connect the reference cell sub bit line to the first main bit line when in a conductive state, and to electrically disconnect the reference cell sub bit line from the first main bit line when in a non-conductive state;
second selection transistors which are each disposed between one of the second main bit lines and one of core cell sub bit lines connected to the plurality of core cells, and are each configured to electrically connect the corresponding core cell sub bit line to the corresponding second main bit line when in the conductive state, and to electrically disconnect the corresponding core cell sub bit line from the corresponding second main bit line when in the non-conductive state;
a third selection transistor which is provided between a third memory cell sub bit line connected to the third memory cell and the third main bit line, and is configured to electrically connect the third memory cell sub bit line to the third main bit line when in the conductive state, and to electrically disconnect the third memory cell sub bit line from the third main bit line when in the non-conductive state;
a column decoder configured to perform gate control to set the first selection transistor, the second selection transistors, and the third selection transistor to the conductive state or the non-conductive state; and
a shield grounding section capable of setting the third main bit line to ground potential, wherein
the third selection transistor is connected to the column decoder, is electrically isolated from the first selection transistor and the second selection transistors, and is configured to be switched between the conductive and non-conductive states by the column decoder independently of the first selection transistor and the second selection transistors.

2. The semiconductor memory device of claim 1, further comprising:
a first discharge transistor which is disposed between the first main bit line and ground, and is configured to connect the first main bit line to ground when in the conductive state, and not to connect the first main bit line to ground when in the non-conductive state;
second discharge transistors which are each disposed between one of the second main bit lines and ground, and are each configured to connect the corresponding second main bit line to ground when in the conductive state, and not to connect the corresponding second main bit line to ground when in the non-conductive state;
a third discharge transistor which is disposed between the third main bit line and ground, and is configured to connect the third main bit line to ground when in the conductive state, and not to connect the third main bit line to ground when in the non-conductive state;
a discharge decoder configured to perform gate control to set the first discharge transistor, the second discharge transistors, and the third discharge transistor to the conductive state or the non-conductive state, wherein
the third discharge transistor is connected to the discharge decoder, is electrically isolated from the first discharge transistor and the second discharge transistors, and is configured to be switched between the conductive and non-conductive states by the discharge decoder independently of the first discharge transistor and the second discharge transistors, and
the third discharge transistor and the discharge decoder form the shield grounding section.

3. The semiconductor memory device of claim 1, wherein when any one of the plurality of core cells is accessed, the column decoder sets the third selection transistor to the non-conductive state, and the shield grounding section sets the third main bit line to the ground potential.

4. The semiconductor memory device of claim 1, wherein the memory cell array further includes a second reference cell, a plurality of second core cells, and a sixth memory cell,
the semiconductor memory device further includes
a fourth main bit line for the second reference cell,
fifth main bit lines for the plurality of second core cells,
a sixth main bit line for the sixth memory cell, the sixth main bit line being disposed between the fourth main bit line and the fifth main bit lines,
a fourth selection transistor which is disposed between a second reference cell sub bit line connected to the second reference cell and the fourth main bit line, and is configured to electrically connect the second reference cell sub bit line to the fourth main bit line when in the conductive state, and to electrically disconnect the second reference cell sub bit line from the fourth main bit line when in the non-conductive state,
fifth selection transistors which are each disposed between one of the fifth main bit lines and one of second core cell sub bit lines connected to the plurality of second core cells, and are each configured to electrically connect the corresponding second core cell sub bit line to the corresponding fifth main bit line when in the conductive state, and to electrically disconnect the corresponding second core cell sub bit line from the corresponding fifth main bit line when in the non-conductive state,
a sixth selection transistor which is disposed between a sixth memory cell sub bit line connected to the sixth memory cell and the sixth main bit line, and is configured to electrically connect the sixth memory cell sub bit line to the sixth main bit line when in the conductive state, and to electrically disconnect the sixth memory cell sub bit line from the sixth main bit line when in the non-conductive state, and
a second shield grounding section capable of setting the sixth main bit line to the ground potential,
the column decoder is configured to perform the gate control to set the fourth selection transistor, the fifth selection transistors, and the sixth selection transistor to the conductive state or the non-conductive state, the sixth selection transistor is connected to the column decoder, is electrically isolated from the fourth selection transistor and the fifth selection transistors, and is configured to be switched between the conductive and non-conductive states by the column decoder independently of the fourth selection transistor and the fifth selection transistors, and gates of the third selection transistor and the sixth selection transistor are commonly connected to the column decoder.

5. The semiconductor memory device of claim 2, wherein the memory cell array further includes a second reference cell, a plurality of second core cells, and a sixth memory cell, the semiconductor memory device further includes
- a fourth main bit line for the second reference cell,
- fifth main bit lines for the plurality of second core cells,
- a sixth main bit line for the sixth memory cell, the sixth main bit line being disposed between the fourth main bit line and the fifth main bit lines,
- a fourth discharge transistor which is disposed between the fourth main bit line and ground, and is configured to connect the fourth main bit line to ground when in the conductive state, and not to connect the fourth main bit line to ground when in the non-conductive state,
- fifth discharge transistors which are each disposed between one of the fifth main bit lines and ground, and are each configured to connect the corresponding fifth main bit line to ground when in the conductive state, not to connect the corresponding fifth main bit line to ground when in the non-conductive state, and
- a sixth discharge transistor which is disposed between the sixth main bit line and ground, and is configured to connect the sixth main bit line to ground when in the conductive state, and not to connect the sixth main bit line to ground when in the non-conductive state, the discharge decoder is configured to perform the gate control to set the fourth discharge transistor, the fifth discharge transistors, and the sixth discharge transistor to the conductive state or the non-conductive state, the sixth discharge transistor is connected to the discharge decoder, is electrically isolated from the fourth discharge transistor and the fifth discharge transistors, and is configured to be switched between the conductive and non-conductive states by the discharge decoder independently of the fourth discharge transistor and the fifth discharge transistors, and gates of the third discharge transistor and the sixth discharge transistor are commonly connected to the discharge decoder.

6. The semiconductor memory device of claim 1, wherein the third memory cell is a dummy cell.

7. The semiconductor memory device of claim 1, wherein the reference cell is disposed to be adjacent to the third memory cell in the memory cell array.

8. The semiconductor memory device of claim 1, wherein the third memory cell is disposed at an end of a sector of the memory cell array.

9. The semiconductor memory device of claim 1, wherein when the third memory cell is accessed, the third selection transistor is set to the conductive state, and the third main bit line is not set to the ground potential.

10. The semiconductor memory device of claim 1, wherein the memory cell array has a virtual ground type configuration.

11. The semiconductor memory device of claim 1, further comprising:
- a sense amplifier including a first input terminal and a second input terminal, and configured to perform comparison between voltage values or current values input to the first input terminal and the second input terminal; and
- a switch configured to selectively connect the first main bit line to the first input terminal and to selectively connect the second main bit lines and the third main bit line to the second input terminal.

12. The semiconductor memory device of claim 1, wherein the column decoder receives an address signal for selecting a column of the memory cell array and a shield selection signal for controlling shield operation.

13. The semiconductor memory device of claim 2, wherein the discharge decoder receives an address signal for selecting a column of the memory cell array and a shield selection signal for controlling shield operation.

* * * * *